Aug. 13, 1957 E. FEIGL 2,802,946

ULTRAHIGH-FREQUENCY CONVERTER

Filed June 8, 1953 2 Sheets-Sheet 1

ERICH FEIGL,
INVENTOR.

BY HUEBNER, BEEHLER, WORREL & HERZIG,
ATTORNEYS.

Albert M. Herzig

ULTRAHIGH-FREQUENCY CONVERTER

Filed June 8, 1953 2 Sheets-Sheet 2

ERICH FEIGL,
INVENTOR.

BY HUEBNER, BEEHLER,
WORREL & HERZIG,
ATTORNEYS.

Albert M Herzig

United States Patent Office 2,802,946

Patented Aug. 13, 1957

2,802,946

ULTRAHIGH-FREQUENCY CONVERTER

Erich Feigl, Los Angeles, Calif., assignor to Trans-Tel Corporation, Los Angeles, Calif., a corporation of California Application June 8, 1953, Serial No. 360,295

6 Claims. (Cl. 250—40)

This invention relates to tuning apparatus for electronic circuits, and more particularly to apparatus for tuning a radio or T-V receiver in the ultra high frequency range.

It is an object of this invention to provide simple and compact tuning apparatus whereby ganged tuning of all essential stages of a radio receiver may be readily effected.

It is another object of this invention to provide tuning apparatus having both coarse and fine tuning, the coarse tuning being effected by physically switching different tuning components into the circuit, the fine tuning being effected by gang adjustment of tuning capacitors.

It is a further object of this invention to provide tuning apparatus having a high Q with resultant sharp tuning.

It is another object of this invention to provide tuning apparatus employing coupled resonant circuits in which the coupling capacitance is varied simultaneously with the tuning of the resonant circuits whereby the coupling impedance tends to remain substantially constant over the frequency range of the apparatus.

It is a further object of this invention to provide tuning apparatus embodying novel adjustable capacitance means of compact structure.

In accordance with these and other objects which will become apparent hereinafter, a preferred form of the instant invention will be described with reference to the accompanying drawings wherein.

Figure 1:
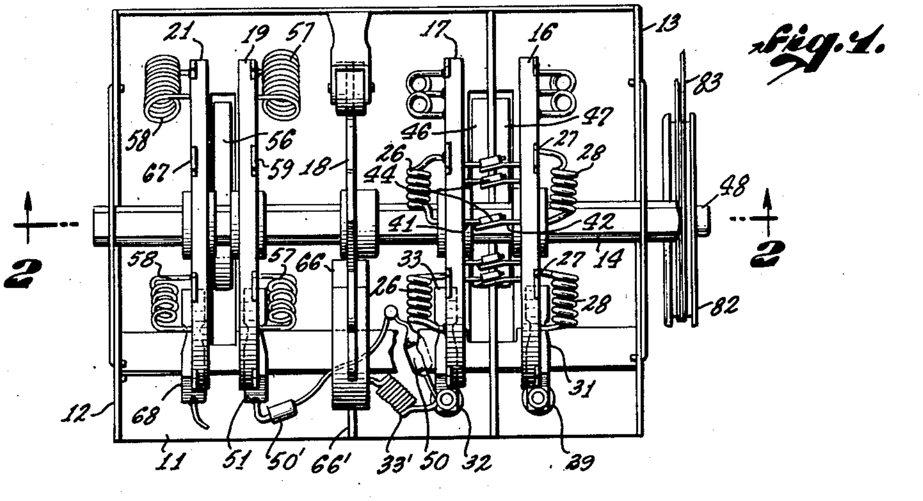
Figure 1 is a top plan view looking down into the tuning apparatus.

Referring to the drawings, 11 designates a case having end walls 12 and 13. Rotatably mounted in the end walls and extending beyond the end wall 13 is a shaft 14. Spaced along the shaft 14 and keyed thereto by any suitable means, preferably adjustable, are an insulating disk 16, an insulating disc 17, a star wheel 18, an insulating disc 19, and an insulating disc 21.

Figure 5:
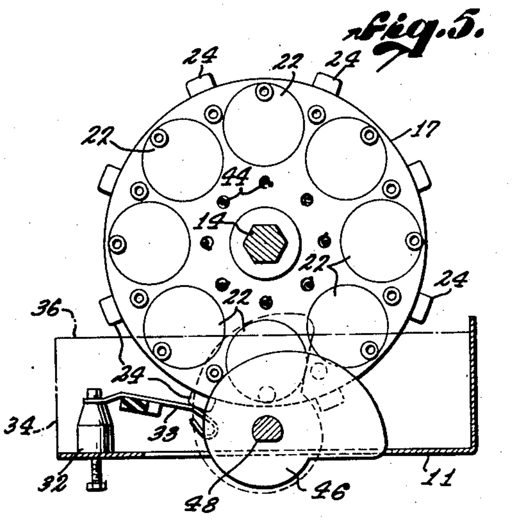

The discs 16 and 17 are similar. Referring to Figure 5, the disc 17 is shown having a plurality of circular conducting members 22 embedded therein and spaced circumferentially thereabout. The conducting members 22 constitute capacitor plates which are aligned with respective plates 23 in the disc 16 and which, with the plates 23, form a plurality (in this case eight) capacitors spaced circumferentially about the discs 16 and 17.

Figure 2:
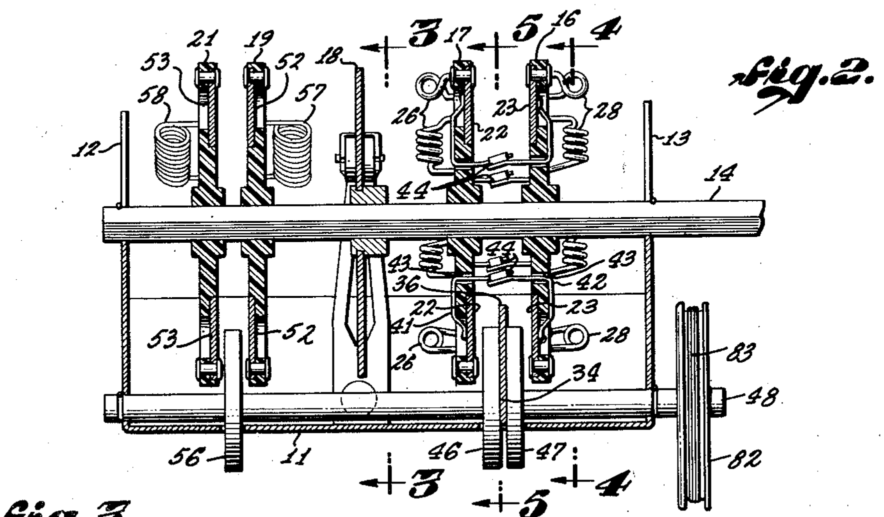
Figure 2 is a vertical longitudinal section taken on line 2—2 of Figure 1.
Figure 3:
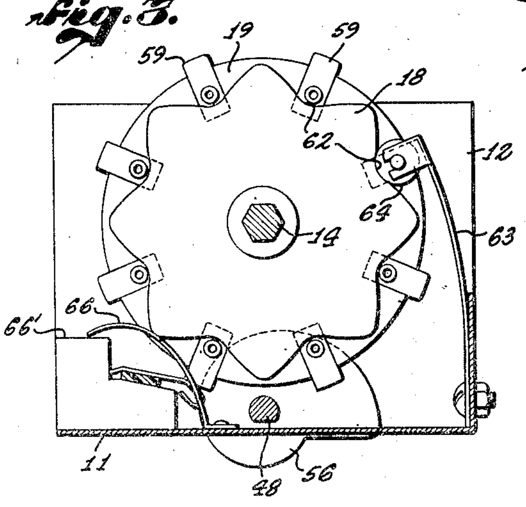
Figures 3, 4 and 5 are cross-sections taken on the respective numbered lines of Figure 2.
Figure 6:
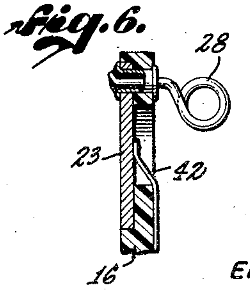
Figures 6 and 7 are respectively, fragmentary sectional views taken on the corresponding lines in Figure 4.
Figure 7:
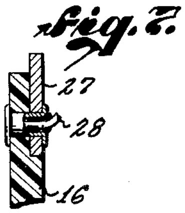
Figure 4:
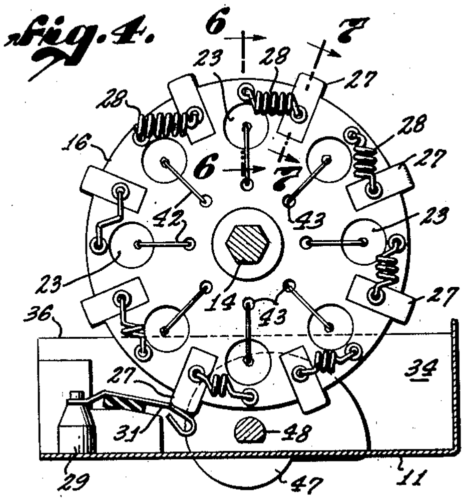

Each plate 22 has associated therewith a peripheral contact or terminal 24. The respective contacts 24 and plates 22 are connected together by circuit means consisting of an equal plurality of inductors 26. The disc 16 is similarly provided with peripheral contacts 27, each of which is connected to its corresponding capacitor plate 23 by an inductor 28, shown in Figure 4. As best shown in Figures 1, 2 and 4, the contacts 27 and inductors 28 are disposed on the back side of the disc 16, i. e., the side which does not face the corresponding disc 17. In similar manner the contacts 24 and inductors 26 of the disc 17 are disposed on the back side of that disc.

Mounted to the bottom of the case 11 is a trimmer capacitor 29 (Figure 4) which also supports a resilient terminal 31. The terminal 31 is positioned to be selectively engaged by each of the contacts 27 of the disc 16 as the disc is rotated by the shaft 14. A similar trimmer capacitor 32 also supports a similar resilient terminal 33 positioned to engage the several contacts 24 carried by the disc 17. A choke coil 33' is included for A.-C. return for the R. F.

Secured to the floor of the case 11, intermediate of the discs 16 and 17, is an upstanding conducting plate 34. As best seen in Figure 2, the upper edge 36 of the plate 34 terminates below the upper portions of the two lowest capacitor plates 22 and 23. These lowest capacitor plates are the ones which are respectively in the circuit, since they are connected to the respective contacts 24 and 27, which are in that position engaged by terminals 31 and 33, as seen in Figures 4 and 5. Since the plate 34 extends partially into the electric field between the plates 22 and 23, it serves to divide the region between the plates 22 and 23 into two capacitors 37 and 38 (Figure 8), each of which has one terminal grounded (this being the plate 34), the other two terminals comprising the respective plates 22 and 23. However, since the upper edge of the plate 34 terminates below the level of the capacitor plates 22 and 23, there is also a direct capacitive action represented by the capacitor 39, in Figure 8, between the plates 22 and 23.

In addition to the capacitive action between the plates 22 and 23, an auxiliary capacitor is shunted between the plates 22 and 23, this auxiliary capacitor being formed by the wires 41 and 42 (Figure 2). These wires are soldered respectively to the reverse surfaces of the plates 22 and 23, which reverse surfaces are made accessible through access openings 43 formed in the discs 16 and 17. The wires extend from the respective capacitor plates across the rear faces of the discs toward the shaft 14, and are then projected forwardly through the discs 16 and 17. The projected ends of the wires 41 and 42 are insulated from each other and held in juxtaposition, as shown at 44, thereby to constitute an auxiliary capacitor, coupling the capacitor 39 formed between the plates 22 and 23.

Figures 8, 9, 10:
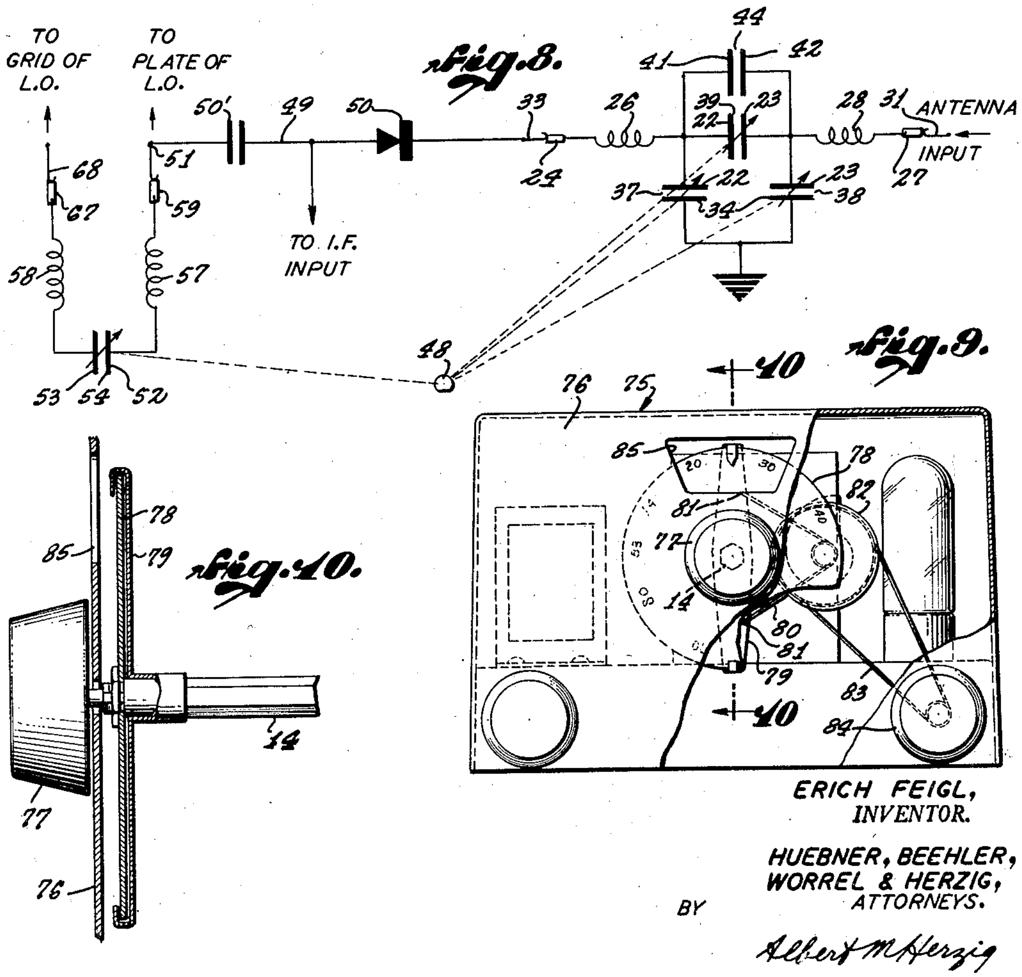
Figure 8 is a schematic diagram showing the equivalent circuitry involved in the apparatus of Figures 1–7.
Figure 9 is a front view of a preferred form of cabinet incorporating the above described converter.
Figure 10 is a vertical sectional view of the front of said cabinet taken as on a line 10—10 of Figure 9.

Referring to Figure 8, it will be seen that the apparatus thus described constitutes a resonant coupled circuit, by means of which incoming R. F. signals applied from the antenna are passed through the terminal 31 to whichever contact 27 has been brought into engagement with the terminal 31 by the selective rotation of the shaft 14. From that particular contact 27, the signal passes to the associated series resonant circuit comprising the inductor 28 and the capacitor 38, and thence to ground.

The signal appearing at the upper terminal of the capacitor 38, i. e., on the plate 23, is coupled through the capacitors 39 and 44 to the midpoint of a second series resonant circuit comprised of the inductor 26 and the capacitor 37. From the other terminal of the inductor 26 the signal passes to the associated contact 24 and thence to the resilient terminal 33.

It will be noted that the capacitors 37, 38 and 39, in Fig. 8, have been shown to be adjustable or variable. Such adjustability is brought about by means for varying or adjusting the dielectric permeability between and among the plates 22, 23 and 34.

This variation is achieved by the provision of a pair of similar cam-shaped dielectric plates 46 and 47 mounted to a shaft 48, which is disposed parallel to the shaft 14 and rotatably mounted in the end walls 12 and 13.

As best seen in Figure 2, the plate 46 is located between the disc 17 and the ground plate 34, and the dielectric cam 47 is located between the disc 16 and the plate 34. As best seen in Figures 4 and 5, the cams 46 and 47 are of increasing radius with changing angular displacement. Thus, as the shaft 48 is rotated counterclockwise, in Figures 4 and 5, an increasing area between the plates 22 and 23 becomes occupied by dielectric, since the material of the cams 46 and 47 preferably has a dielectric permeability appreciably greater than air, and preferably more than four times that of air, there will be a corresponding increase in the capacitance of the two capacitors 37 and 38 as the shaft 48 is rotated counterclockwise.

Since the cams 46 and 47 also extend into the region above the ground plate 34, there will also be an increasing capacitance of the coupling capacitor 39, particularly in the low frequency tuning region where the capacitors 37 and 38 are of maximum value.

As is well known, change in the capacitances 37 and 38 changes the tuned frequency of the resonant circuits. In accordance with the instant invention, it will be seen that this change in tuning effected through rotation of the shaft 48 also changes the capacitance of the coupling capacitor 39. Since the capacitance at 39 is increased as the frequency is decreased, there will be a tendency for the coupling impedance to be relatively constant over the tuning band.

In addition to the coupling through the capacitor 39, there is a certain fixed coupling through the capacitor 44.

The terminal 33 is connected by a conductor 49, in series, through a crystal 50 and a capacitor 50′—respectively, for conversion to I. F. and for giving injection for conversion—to a similar terminal 51 associated with the tuning disc 19. The discs 19 and 21 are essentially the same as the discs 16 and 17, except that the auxiliary coupling capacitor 44 is omitted. Also omitted is the ground plate 34, so that the only action of the capacitor plates 52 and 53 of the discs 19 and 21, respectively, is to form a capacitive coupling 54 (Figure 8) between each other.

This coupling is also made variable or adjustable by the provision of a single dielectric cam 56 also keyed to the shaft 48 and located between the discs 19 and 21. Like the discs 16 and 17, the discs 19 and 21 are also provided with inductors 57 and 58 connected between the respective capacitor plates 52 and 53, and the several peripheral contacts spaced around the discs.

In order to restrain the several contacts 24, 27 and 59, selectively in proper position in engagement with their respective terminals 31, 33 and 51, the star wheel 18 is provided having a plurality of peripheral indentations 62 corresponding to the number of contacts 59, etc. Urged inwardly against the periphery of the wall 13 by a resilient arm 63 is a roller detent 64, which serves to position the contacts 59, etc., in proper dielectric engagement with their respective terminals 51, etc. Further frictional rotation of the star wheel 18 is effected by a spring drag 66 which also presses against the periphery of the star wheel 18. Said spring drag 66 bears againt a metal block 66′ which, like the resilient arm 63, is grounded.

The contacts 67 on the disc 21 are engaged by a resilient terminal 68.

As shown in Figure 8, the terminal 68 is adapted to be connected to the grid of a local oscillator tube, while the terminal 51 is adapted to be connected to the plate of the tube. Either the terminal 33 or the terminal 51 is connected to the input of the I. F. detector.

It will thus be seen that turning of the shaft 14 effects coarse or rough tuning of the local oscillator, of the antenna circuit 28—38, and of the mixer circuit 26—37. This tuning, it will readily be understood, is effected by actual physical changing the inductors and capacitors which are in the circuit, this change being effected by rotation of the discs 16, 17, 19 and 21.

Fine tuning of the apparatus is effected by gang tuning of the condensers 54, 37, 38 and 39 through the shaft 48.

A cabinet 75 for housing the above described apparatus includes a front panel 76, through which the shafts 14 and 48 extend. On the shaft 14 a handable knob 77 is keyed. An indexing disc 78 is also keyed to said shaft. A finger 79 is rotatably secured to the shaft 14 and is movable relative to said shaft and to the indexing disc 78 for tuning between steps in the star wheel, such fine tuning being accomplished by a cord 80, secured as at 81 to the finger 79, and rotatable by means of a mechanical advantage pulley 82 rotatable as by a cord 83 operatively associated with a fine tuning knob 84.

The knob 77 turns the shaft 14 through the various positions of the star wheel relative to the detent roller 64. The fine tuning is accomplished by the rotation of the shaft 48 by means of the fine tuning knob 84, as evidenced through a window 85 in the panel 76, wherein the finger pointer 79 is visible in its movement relative to the indexing disc 78.

The metal shield 34 between the two cam-like discs 46 and 47 normally provides the shield between the antenna circuit essentially contained upon the disc 16 and the mixer circuit essentially contained upon the disc 17. The metal shield 34 is preferably approximately 10 percent lower than the height of the condenser forming discs 22 and 23 relative to the diameter of such discs 22 or 23. Because it is desired to secure a fixed coupling between the two circuits, a certain amount of height is required to obtain a capacitor change, and relatively higher capacitance is thereby achieved on the lower side of the frequency band. The construction of said cam shaft discs 46 and 47 is preferably such that with their longest radius uppermost, as shown in Figure 5, the upper edge 36 of the plate 34, and the corresponding top edges of the cams 46 and 47, lie in a common horizontal line—that is, the cams 46 and 47 have a maximum height preferably just covering the discs 22 and 23.

By the instant construction and arrangement a wide range of tuning is achieved, with good convenience, and the relationship of the parts is also such as to provide a high Q.

A preferred material for the cam discs 46 and 47, as well as for the cam disc 56, is silicone fiberglass. Alkyd resins and fiberglass Orlon are also usable to advantage. With the use of the preferred materials above mentioned, and the arrangement herein shown and described, a range of from 450 to 900 mc. is covered in the optional eight steps shown on the star wheel 18 through the use of both the coarse and the fine tuner.

Although I have herein shown and described my invention in what I have conceived to be the most practical and preferred embodiment, it is recognized that departures may be made therefrom within the scope of my invention, which is not to be limited to the details disclosed herein but is to be accorded the full scope of the claims so as to embrace any and all equivalent means and methods.

Having thus described my invention, what I claim as new and desire to secure by Letters Patent is:

1. Tuning apparatus comprising a rotatably mounted shaft, a first pair of opposed discs secured to said shaft and rotatable thereby, a plurality of contact terminals spaced around the periphery of each disc, a pair of fixed terminals positioned to engage, respectively, the disc contacts as said shaft is rotated, said discs having a plurality of opposed capacitor plates disposed circumferentially around said disc, the plates on one disc facing those on another disc thereby to form a plurality of capacitors spaced circumferentially around said discs, a plurality of inductors connected, respectively, between said disc contacts and the associated capacitor plates, a stationary intermediate conducting plate disposed between said discs and between two opposed capacitor plates, a second shaft rotatably mounted parallel to said first shaft, a pair of cam-shaped dielectric plates mounted to said second shaft and disposed, respectively, between said discs and said stationary plate, said dielectric plates extending beyond the edge of said stationary plate whereby rotation of said second shaft adjusts the capacitance between each of the capacitor plates and said stationary discs and also between the two opposed capacitor plates.

2. A tuner comprising a frame, and a shaft mounted for rotation in the frame, a plurality of dielectric discs mounted in spaced parallel coaxial relationship to one another on said shaft, metallic plate capacitors mounted in pairs in series spaced about the circumference of said dielectric discs, inductances connected in series between said respective pairs of capacitors, a second shaft spaced laterally from said first shaft, rotatably mounted in the frame, and a dielectric cam-shaped disc mounted on said second shaft for rotation therewith and selectively movable between said dielectric discs, said series pairs and inductors on adjacent discs being in axial alignment relative to said discs whereby rotation of said first shaft brings selected series pairs and inductances into positions of adjacency to said second shaft, and whereby rotation of said second shaft causes selected shielding of said pairs and inductors by means of said cam-shaped disc.

3. A tuner as defined in claim 2, said cam-shaped disc being formed of a dielectric material whose constant is greater than four.

4. A tuner as defined in claim 2, and wherein said cam-shaped disc is bifurcate on a plane normal to its axis, said frame being grounded, and a metal plate electrically connected to the frame extending between the bifurcate portions of the cam-shaped disc, said metal plate terminating towards said first shaft short of the innermost margins of said capacitor pairs.

5. A tuner comprising two dielectric discs, metallic discs spaced around the periphery of said dielectric discs in juxtaposition, means connecting said metallic discs into a tuner circuit, dielectric means interposed between selected juxtaposed metallic discs, means for varying the extent of interposition of said dielectric means between said selected juxtaposed discs, and means for changing the respective positions of said dielectric means and said metallic discs on said dielectric discs.

6. A tuner as defined in claim 5, each of said metallic discs being connected in series with a coil and a second metallic plate positioned respectively in corresponding spaced relationship around the dielectric discs, and a capacitor coupling between said juxtaposed capacitor-inductance series.

References Cited in the file of this patent

UNITED STATES PATENTS

| | | |
|---|---|---|
| 2,078,909 | Gunther | Apr. 27, 1937 |
| 2,385,131 | Garthwaite | Sept. 18, 1945 |
| 2,395,520 | Toth | Feb. 26, 1946 |
| 2,461,832 | Meacham | Feb. 15, 1949 |
| 2,480,187 | Gamertsfelder | Aug. 30, 1949 |
| 2,543,891 | Carlson et al. | Mar. 6, 1951 |
| 2,620,378 | Thias | Dec. 2, 1952 |